(12) United States Patent
Vilhauer et al.

(10) Patent No.: US 9,026,387 B2
(45) Date of Patent: May 5, 2015

(54) BATTERY VOLTAGE MEASUREMENT

(75) Inventors: Reed T. Vilhauer, Portland, OR (US); Peter T. Li, Portland, OR (US); Darren S. Crews, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 645 days.

(21) Appl. No.: 13/078,325

(22) Filed: Apr. 1, 2011

(65) Prior Publication Data

US 2012/0253714 A1 Oct. 4, 2012

(51) Int. Cl.
*G01R 5/00* (2006.01)
*G06F 3/01* (2006.01)
*G06F 3/023* (2006.01)
*G01R 31/36* (2006.01)
*G01R 19/165* (2006.01)

(52) U.S. Cl.
CPC ...... *G01R 31/3624* (2013.01); *G01R 19/16542* (2013.01)

(58) Field of Classification Search
USPC ............ 702/63, 121, 130, 183, 188; 320/141; 324/433; 345/76
See application file for complete search history.

(56) References Cited

U.S. PATENT DOCUMENTS

| | | | |
|---|---|---|---|
| 5,315,228 A | 5/1994 | Hess et al. | |
| 5,572,110 A | 11/1996 | Dunstan | |
| 5,600,230 A | 2/1997 | Dunstan | |
| 5,619,430 A * | 4/1997 | Nolan et al. | 702/63 |
| 6,144,187 A * | 11/2000 | Bryson | 320/137 |
| 6,184,660 B1 * | 2/2001 | Hatular | 320/141 |
| 7,414,389 B2 | 8/2008 | Nguyen | |
| 7,630,843 B2 | 12/2009 | Nguyen | |
| 7,751,994 B2 | 7/2010 | Matsumura et al. | |
| 7,795,843 B2 | 9/2010 | Keates et al. | |
| 2009/0248331 A1 | 10/2009 | Barsukov | |
| 2010/0023285 A1 | 1/2010 | Nakanishi | |

FOREIGN PATENT DOCUMENTS

| | | |
|---|---|---|
| JP | 2001-231179 | 8/2001 |
| JP | 2004-109007 | 4/2004 |
| WO | 2012/141755 A1 | 10/2012 |

OTHER PUBLICATIONS

International Search Report and Written Opinion for Application PCT/US2011/067548 dated Aug. 28, 2012.
Taiwanese Office Action and Search Report dated Oct. 30, 2013 and English language translation.
International Preliminary Report on Patentability and Written Opinion received for PCT Patent Application No. PCT / US2011/067548, mailed on Oct. 10, 2013, 7 pages.

* cited by examiner

*Primary Examiner* — Eliseo Ramos Feliciano
*Assistant Examiner* — Felix Suarez
(74) *Attorney, Agent, or Firm* — KED & Associates LLP

(57) ABSTRACT

An apparatus is provided that includes a first circuit to determine when a battery current falls below a threshold, a second circuit to measure a battery voltage and current in response to the first circuit determining that the battery current falls below the threshold, and a third circuit to store the measured battery voltage and current.

21 Claims, 3 Drawing Sheets

BATTERY VOLTAGE MEASUREMENT

BACKGROUND

1. Field

Embodiments may relate to measuring an open circuit voltage (OCV) of a battery.

2. Background

Batteries are used in many of today's mobile electronic devices, such as cellular phones and laptop computers. The batteries may be rechargeable. The electronic devices may also be capable of utilizing AC power. The battery power is utilized when AC power is not convenient or is not available. Accurate information regarding a remaining capacity of the battery may be relevant.

BRIEF DESCRIPTION OF THE DRAWINGS

The following represents brief descriptions of the drawings in which like reference numerals represent like elements and wherein.

DETAILED DESCRIPTION

Figure 1:
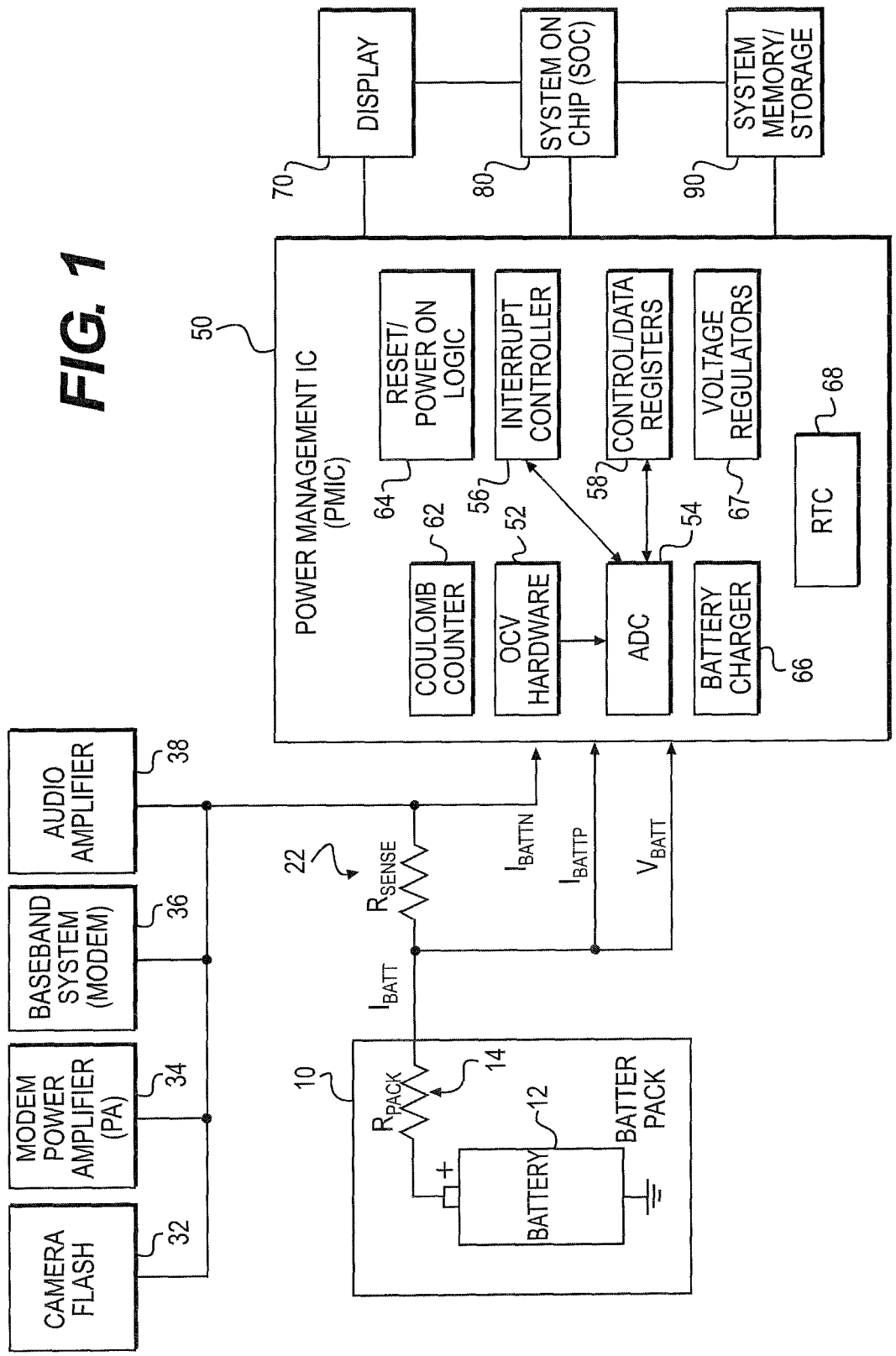
FIG. 1 shows an electronic device (or apparatus) having a battery pack and a power management integrated circuit (PMIC)

In the following detailed description, like reference numerals and characters may be used to designate identical, corresponding and/or similar components in differing figures. Further, in the detailed description, example sizes/models/values/ranges may be provided although embodiments are not limited to the same. Where specific details are set forth in order to describe example embodiments, it should be apparent to one skilled in the art that embodiments may be practiced without these specific details.

Smartphones, electronic cameras, tablets and other electronic devices have significantly improved lives of consumers. These devices are usually powered by batteries at least part of the time, and power management may be a focus of system and chip designers.

Batteries may provide a "fuel gauge" that gives an indication of a charge level of the battery (or battery cell). For example, U.S. Pat. No. 5,315,228 describes a rechargeable battery that measures battery discharge current and estimates battery self-discharge to predict a remaining capacity of the battery (i.e., how full the "battery tank" is to continue the analogy of the "fuel gauge"). Fuel gauging may be provided for all discharges from the battery.

To provide warning of low battery conditions, mobile terminals, such as computer systems, may provide a run-time alarm that indicates when the battery has less than a prescribed amount of time remaining at a present discharge rate.

The fuel gauge or fuel gauge algorithm may be used to indicate a battery capacity. A power consumption variation may be due to power management systems that turn on and off a hard-disk, a liquid crystal display (LCD) screen backlight, a processor, etc., under various conditions to save or conserve battery power.

Embodiments may be described with respect to an electronic device. The electronic device may be a smartphone, a personal digital assistant, a camera, an mp3 player, a tablet, an e-reader, a laptop or notebook computer, and/or a mobile terminal with computing and/or communication capability.

A power manager (or power management device) may manage power of an electronic device powered by a battery at least part of the time. The battery may be a lithium-ion battery, a lithium-polymer battery, and/or another type of battery capable of providing power sufficient to operate one or more of a processing unit (e.g., 1.6 GHz processor), a high-definition (HD) video engine, an image sensor processor, a camera flash, hands-free speakers and/or any of a number of other features of the electronic device.

FIG. 1 is a block diagram of an electronic device (or apparatus) having a power management integrated circuit (PMIC). Other configurations may also be provided.

More specifically, FIG. 1 shows an electronic device that includes a battery pack 10 and a power management IC (PMIC) 50 as well as various other components of the electronic device. The PMIC 50 may hereafter be referred to as a power management device. Other large power consuming components of the electronic device may include a camera flash 32, a modem power amplifier (PA) 34, a baseband system or modem 36, and an audio amplifier 38. The electronic device may further include a display 70, a system on chip (SOC) 80 and a system memory/storage 90. Other components of the electronic device may also be provided, but are not shown for ease of illustration.

The battery pack 10 may include a battery 12 (or battery cell) that may be removable and/or rechargeable and a series equivalent resistor $R_{PACK}$ 14. The battery 12 may have a positive node and a negative node. An open circuit voltage (OCV) may be measured (or sensed) at the positive node of the battery 12. The battery 12 may power components of the electronic device such as a processor.

A sense resistor $R_{SENSE}$ 22 may be further provided between the battery pack 10 and the PMIC 50. The series equivalent resistor $R_{PACK}$ 14 represents an inherent equivalent resistance in the battery pack 10.

The PMIC 50 (or power management device) may be an integrated circuit that includes various components such as an open circuit voltage (OCV) hardware 52, an analog-to-digital converter (ADC) 54, an interrupt controller 56 and control/data registers 58. Other components of the power management IC 50 may include a coulomb counter 62, reset/power on logic 64, a battery charger 66, a voltage regulator 67 and a real time clock (RTC) 68. Portions of the PMIC 50 may be part of a processor, and/or may be separate from a processor. Other components may also be provided, but are not shown for ease of illustration.

Figure 2:
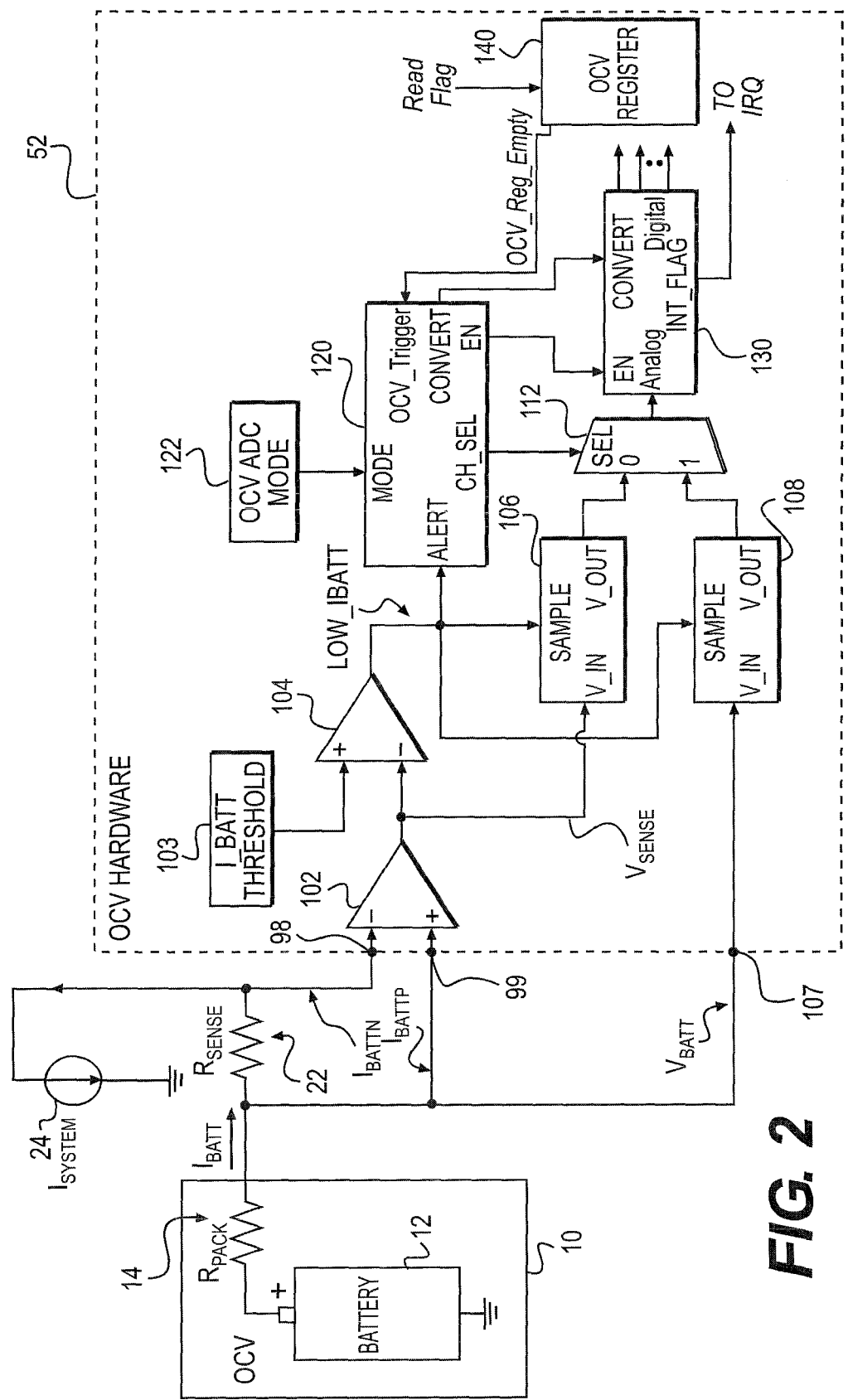
FIG. 2 shows an electronic device (or apparatus) having a battery pack and components of a power management integrated circuit according to an example embodiment.

FIG. 2 shows an electronic device (or apparatus) having a battery pack and components of a power management integrated circuit according to an example embodiment. Other embodiments and configurations may also be provided.

FIG. 2 only shows circuitry and logic of the OCV hardware 52 without showing other components of the PMIC 50 (such as other components shown in FIG. 1). Components of PMIC 50 (including the OCV hardware 52) may be provided on an integrated circuit, and may be part of a processor. The components of the PMIC 50 such as the OCV hardware 52 may be considered as part of a power management device.

FIG. 2 further shows a sensing device to sense a battery current. The sensing device may include the sense resistor $R_{SENSE}$ 22. The current source 24 represents the system current $I_{SYSTEM}$ being drawn from the battery pack by components in the electronic device or system.

The OCV hardware 52 may include a sense amplifier 102, a comparator 104, two sample and hold circuits 106 and 108, a multiplexer (MUX) 112, a control device 120, an analog to digital converter ADC 130 and a register 140 (or registers). Other elements/components may be provided, but are not shown for ease of illustration.

Embodiments may provide hardware and logic that may automatically perform a battery open circuit voltage (OCV) measurement (or sensing) during a normal system operation of the electronic device. As shown in FIG. 2, components of hardware and logic may be provided within the PMIC 50 and/or may be provided within a mixed signal integrated circuit MSIC.

The battery pack 10 may include the battery 12 (or battery cell) and the series battery resistor $R_{PACK}$ 14. The series resistor $R_{PACK}$ 14 is an equivalent series resistance that includes battery cell resistance, protection field effect transistor (FET) resistance, fuse resistance, and/or other resistances such as connectors and board traces. The battery 12 may be removable from the battery pack 10 and/or may be rechargeable. The sensing device may be provided between the battery 12 and the OCV hardware 52.

The OCV hardware 52 may have input nodes 98, 99 and 107 (or input terminals). Based on the sensing device, an analog battery voltage $V_{BATT}$ may be provided at the input node 107. The analog voltage $I_{BATTP}$ may be provided at the input node 99, and the analog voltage $I_{BATTN}$ may be provided at the input node 98. The analog voltage differential across the input node 99 and the input node 98 is provided based on current $I_{SYSTEM}$ represented by the current source 24 and based on the sense resistor $R_{SENSE}$ 22.

During normal usage of the electronic device, a value of the battery current $I_{BATT}$ may be high enough so that the voltage drop ($I_{BATT} \times (R_{PACK} + R_{SENSE})$) is non-trivial. Thus, the battery voltage $V_{BATT}$ may not be equal to the open circuit voltage (OCV). However, this may not be the case when the battery current is low and the current (I) and resistor (R) losses are negligible.

Embodiments may provide hardware, such as on the integrated circuit, so that the analog battery voltage $V_{BATT}$ may be measured (or determined or sensed) at specific times, such as during a low current draw the battery voltage may equal the open circuit voltage (OCV) of the battery cell itself. The OCV may determine a battery state of charge (SOC), which may be used to determine a remaining energy in the battery 12. This may provide accurate charge measurements of a battery state that may be used during a fuel gauging algorithm of the electronic device (or apparatus). By performing the OCV measurement in hardware (such as in the OCV hardware 52), a system load at a time of measurement may be very low, and this may increase an accuracy of the fuel gauging.

The sense amplifier 102 may be a sense amplifier (or differential amplifier) to sense a differential voltage across the $R_{SENSE}$ 22. A positive input terminal (+) of the sense amplifier 102 may correspond to the input at the input node 99. A negative input terminal (−) of the sense amplifier 102 may correspond to the input at the input node 98. The differential voltage at the positive input terminal (+) and the negative input terminal (−) is proportional to the battery current. The sense amplifier 102 may read or determine a present battery current value by receiving the analog voltage $I_{BATTP}$ at the positive input terminal (of the sense amplifier 102) and by receiving the analog voltage $I_{BATTN}$ at the negative input terminal (of the sense amplifier 102). The sense amplifier 102 may provide an output voltage $V_{SENSE}$ that corresponds to the battery current $I_{BATT}$ based on inputs at the positive and negative terminals of the sense amplifier 102.

The sense amplifier 102 may receive two inputs ($I_{BATTN}$, $I_{BATTP}$) and a voltage difference between the two inputs, which is proportional to the battery current $I_{BATT}$, is amplified by the sense amplifier 102. The output of the sense amplifier 102 is a voltage $V_{SENSE}$ (corresponding to the battery current $I_{BATT}$).

The comparator 104 may include a positive input terminal (+) and a negative input terminal (−). The output voltage $V_{SENSE}$ (that corresponds to the battery voltage $I_{BATT}$) of the sense amplifier 102 may be provided to the negative input terminal of the comparator 104. This voltage represents the amount of current flowing through the sense resistor $R_{SENSE}$ 22 and thus flowing from the battery 12.

A battery current I_BATT threshold 103 (or threshold value) may be provided and/or may be stored by the electronic device. The I_BATT threshold 103 may be programmable, such as by a user. The battery current I_BATT threshold 103 may be provided to the positive input terminal of the comparator 104.

Based on a comparison of the output voltage $V_{SENSE}$ (that corresponds to battery current $I_{BATT}$) from the sense amplifier 102 and the battery current I_BATT threshold 103, when the battery current is low enough (i.e., below a trip point), the comparator 104 may output a signal LOW_IBATT, which indicates that there is a low current draw from the battery 12. That is, when the voltage $V_{SENSE}$ that corresponds to battery current $I_{BATT}$ is less than the battery current I_BATT threshold 103, the signal LOW_IBATT (indicating a low current draw) output from the comparator 104 may be high (or a '1'). This may be considered a tripping signal, a triggering signal and/or a battery current indicator signal. A point at which the comparator 104 trips may be adjusted by changing the battery current I_BATT threshold 103.

The sample and hold circuit 106 and the sample and hold circuit 108 may collectively be referred to as a hold circuit. The sample and hold circuit 106 is a latch having a trigger input (SAMPLE) terminal, an input V_IN terminal and an output V_OUT terminal. The sample and hold circuit 108 is a latch having a trigger input (SAMPLE) terminal, an input V_IN terminal and an output V_OUT terminal. Other input and output terminals may be provided on the sample and hold circuit 106 and the sample and hold circuit 108.

The output from the comparator 104 may be provided to the trigger input terminal of the sample and hold circuit 106, and may be provided to the trigger input terminal of the sample and hold circuit 108. Accordingly, the signal LOW_I-BATT (indicating the low battery current) output from the comparator 104 may be provided to both the trigger input terminal of the sample and hold circuit 106 and the trigger input terminal of the sample and hold circuit 108. The LOW_IBATT (indicating the low battery current) output from the comparator 104 may be further provided to an ALERT input terminal of the control device 120.

The input V_IN terminal of the sample and hold circuit 106 is coupled to the output terminal of the sense amplifier 102 such that the sample and hold circuit 106 receives the battery voltage $V_{SENSE}$ (corresponding to the battery current $I_{BATT}$) that is output from the sense amplifier 102. The input V_IN terminal of the sample and hold circuit 108 is coupled to the input node 107 so as to receive the analog battery voltage $V_{BATT}$.

When the comparator 104 trips and the signal LOW_I-BATT (indicating the low battery current) goes HIGH (or '1'), the sample and hold circuit 106 may capture (or store) the battery voltage $V_{SENSE}$ corresponding to the battery current $I_{BATT}$ at that moment. Further, when the comparator 104 trips and the signal LOW_IBATT (indicating the low battery current) goes HIGH (or to '1'), the sample and hold circuit 108 may capture (or store) the analog battery voltage $V_{BATT}$ at that moment. Therefore, the battery voltage $V_{SENSE}$ (corresponding to the battery current $I_{BATT}$) and the battery voltage $V_{BATT}$ are captured (or stored) at a same time. The captured signals may therefore be stored in the hold circuit (that includes the sample and hold circuit 106 and the sample and hold circuit 108).

As will be discussed below, the battery voltage $V_{SENSE}$ (corresponding to the battery current $I_{BATT}$) in the sample and hold circuit 106 may subsequently be converted into a digital value(s) (or code) by the ADC 130, and the digital value(s) may be stored into the register 140 (or registers). The analog battery voltage $V_{BATT}$ in the sample and hold circuit 108 may also be subsequently converted into a digital value(s) (or digital code) by the ADC 130, and the digital value(s) may be stored in the register 140 (or registers). The digital values stored in the register 140 may be used in a fuel gauge algorithm. The fuel gauge algorithm may be performed by a processor of the electronic device, for example.

The OCV hardware 52 may also include the multiplexer 112, for example. The multiplexer 112 may have a '0' input terminal connected to the output V_OUT terminal of the sample and hold circuit 106, and may have a '1' input terminal connected to the output V_OUT terminal of the sample and hold circuit 108. Based on a select signal input to the select SEL input terminal, the multiplexer 112 may output either the stored battery voltage $V_{SENSE}$ corresponding to the battery current $I_{BATT}$ or the stored analog battery voltage $V_{BATT}$. The values output from the multiplexer 112 may be provided to the analog input terminal of the ADC 130.

The control device 120 may be an OCV ADC control block having input terminals, such as an ALERT input terminal, a MODE input terminal, and an OCV_Trigger input terminal. The control device 120 may further have output terminals, such as a select (CL_SEL) output terminal, an enable (EN) output terminal and a convert output terminal. Other terminals may be provided on the control device 120.

The ADC 130 may include input terminals such as an analog input terminal, an enable (EN) input terminal, and a convert (CONVERT) input terminal. The ADC 130 may further include output terminals such as an interrupt flag (INT_FLAG) output terminal and digital output terminals. The digital values output from the ADC may be N bits, for example. Other input or output terminals may be provided on the ADC 130.

The control device 120 may control a time at which the ADC 130 converts the battery voltage $V_{SENSE}$ corresponding to the battery current $I_{BATT}$ (from the sample and hold circuit 106) into a digital value, and/or control a time at which the ADC 130 coverts the analog battery voltage $V_{BATT}$ (from the sample and hold 108) into a digital value. A time that the ADC 130 performs and completes conversion from analog to digital may be configurable and/or programmable. This may allow the analog to digital conversion to be performed automatically and the digital values to be stored in the register 140 (or registers). This may also allow the analog to digital conversion to be performed at a specifically requested time based on a software request. The 'mode' in which the control device 120 operates in, such as either auto-conversion or conversion upon software request, is determined by the OCV ADC mode 122.

The control device 120 may include logic to power manage the ADC 130. This may save power and avoid performing the open circuit measurements during certain states. The control device 120 may disable the ADC 130 and/or enable the ADC 130 based on an enable signal that is output from the EN output terminal of the control device 120 and is input to the input EN terminal of the ADC 130. The ADC 130 may be disabled for any of various reasons.

The control device 120 may turn on (or enable) the ADC 130 when either of two conditions are met. A first condition to enable the ADC 130 is when the signal LOW_IBATT (indicating the low current draw) is HIGH (or to '1') as determined by the ALERT input terminal of the control device 120. A second condition to enable the ADC 130 is when the register 140 is empty. The control block 120 may determine that the register 140 is empty when the register 140 provides an empty flag (OCV_Reg_Empty) signal to the OCV_Trigger input terminal of the control device 120. This may ensure that extra readings are not performed in standby states, which may waste time and/or energy. Accordingly, the control device 120 may use the empty flag (OCV_Reg_Empty) signal as a power management input so that power management of the control device 120 may be turned off during a normal system operation. In other words, the analog-to-digital conversion may be performed when a low battery current is provided.

Embodiments may allow the analog battery voltage $V_{BATT}$ measurement/sensing to be very close to the open circuit voltage (OCV) value, which may define a charge level of the battery 12. This may also consume very little power, as compared to disadvantageous arrangements. Once digital values of the battery voltage are provided within the register 140, a fuel gauging algorithm may be provided for the electronic device. The fuel gauging algorithm may control components of the electronic device, such as the display 70, based on the stored digital values, for example. This may aid in conserving power of the battery 12.

In the above described embodiment(s), a first circuit may be provided to determine when a battery current falls below a threshold. The first circuit may include the sense amplifier 102 (or differential amplifier) and the comparator 104. The amplifier 102 may sense the battery current and provide an output voltage based on the sensed current. The comparator 104 may receive the output voltage and the threshold, and may provide a current indicator signal based on a comparison of the received output voltage and the received threshold.

Additionally, a second circuit may measure a battery voltage and current in response to the first circuit determining that the battery current falls below the threshold. The second circuit may include the sample and hold circuit 106 and the sample and hold circuit 108.

A third circuit may store a digital value corresponding to the measured battery voltage and current. The third circuit may include the ADC 130, the register 140, and the ADC control device 120.

Once digital values are stored in the register 140, the electronic device may enter into a power-saving mode in which components may be turned off and/or a power consumption may be reduced. If the values are stored, then it may not be necessary for the electronic device to determine the low current draw (unless the battery is recharged).

Figure 3:
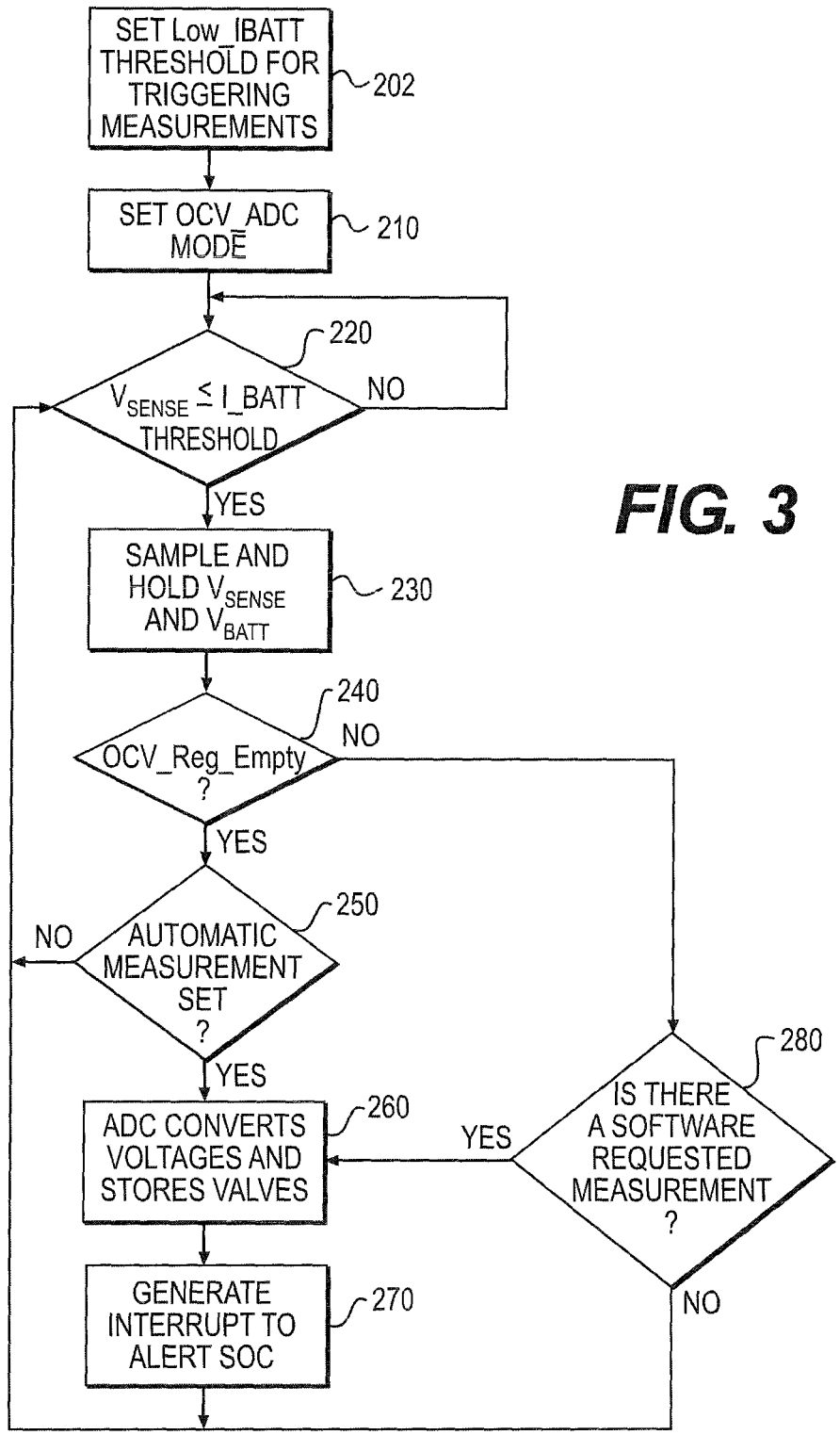
FIG. 3 is a flowchart of a method of controlling an electronic device.

FIG. 3 is a flowchart of a method of controlling an electronic device according to an example embodiment. Other operations, orders of operations and embodiments may also be provided. The operations discussed with respect to FIG. 3 may be provided by elements of the electronic device shown in FIG. 2, for example. However, other elements may also be used to perform the operations of FIG. 3.

FIG. 3 shows that the battery current $I_{BATT}$ threshold 103 may be set in operation 202. The battery current $I_{BATT}$ threshold 103 may be provided for triggering the analog battery voltage measurement (and storage) and the voltage $V_{SENSE}$ corresponding to the analog battery current measurement (and storage).

In operation 210, the ADC control device 120 may set an OCV_ADC mode to either to have an automatic ADC conversion or a conversion upon a software request. Accordingly, the OCV_ADC mode may be programmed or set by a user. The setting of the control device 120 may be accomplished by storing an OCV ADC mode value 122. The OCV ADC mode value 122 may be input to the mode input terminal of the control block 120.

In operation 220, the comparator 104 may compare the voltage $V_{SENSE}$ (corresponding to the analog battery current $I_{BATT}$) with the present I_BATT threshold 103. If the measured voltage $V_{SENSE}$ (corresponding to the battery current $I_{BATT}$) is greater than the present I_BATT threshold (i.e., a No result), then the operation 220 may continuously perform measurements at periodic intervals or other times until the result is different. On the other hand, if the measured voltage $V_{SENSE}$ (corresponding to the battery current $I_{BATT}$) is less than or equal to the present I_BATT threshold in operation 220 (i.e., a Yes result), then the sample and hold circuit 106 may receive the voltage $V_{SENSE}$ corresponding to the battery current $I_{BATT}$ and the sample and hold circuit 108 may receive the analog battery voltage $V_{BATT}$ in operation 230. The voltage $V_{SENSE}$ (corresponding to the battery current $I_{BATT}$) and the analog battery voltage $V_{BATT}$ may be simultaneously received at the sample and hold circuits 106, 108.

A determination may be made by the control block 120 in operation 240 whether the register 140 (or registers) is empty or is not empty. An empty state may be a state in which digital values of the battery current and the battery voltage are not stored in the register 140 (or registers). This determination in operation 240 may be based on the control device 120 monitoring the OCV_Trigger input terminal that may receive the OCV_Reg_Empty signal from the register 140. If the determination is that the register 140 is empty in operation 240 (i.e., a Yes result), then a determination may be made by the control device 120 in operation 250 whether the automatic (voltage and current) measurement is set (i.e., the mode is set to 1, for example). If the automatic (voltage and current) measurement is set in operation 250 (i.e., a Yes result), then the ADC 130 may convert the battery voltage (from the sample and hold circuit 108) into a digital value and convert the battery voltage corresponding to the battery current (from the sample and hold circuit 106) into a digital value, and store the digital values (or codes) in the register 140 (or registers).

An interrupt may be generated in operation 270 to alert the system on chip (SoC 80 from FIG. 1) that the data is ready. At this point, the fuel gauging entity running on the SoC 80 may read the OCV to be used in its battery state of charge algorithm.

Alternatively, when the register 140 (or registers) is not empty in operation 240 (i.e., a No result), then a determination may be made in operation 280 whether the software requested the voltage and current measurements (i.e., the mode is set to 0 for example). If a result of the determination is No in operation 280, then operations may return back to operation 220 for a comparison of the measured voltage corresponding to the battery current to the low battery threshold. If a result of the determination is Yes in operation 280, then the operation 260 may be performed.

Accordingly, the register 140 (or registers) may store digital values of the voltage corresponding to the battery current and the battery voltage. The stored digital values may be used by a fuel gauging algorithm to control components and/or elements of the electronic device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
 a first circuit to receive a battery current from a battery, and to determine when the battery current flowing from the battery and into the first circuit falls below a threshold, the first circuit includes:
  a differential amplifier to receive a first input based on the battery current flowing from the battery, to receive a second input based on the battery current flowing from the battery, to sense the battery current from the battery based on the first input and the second input and to provide an output voltage based on the sensed current; and
  a comparator to receive the output voltage from the differential amplifier and to provide a current indicator signal based on a comparison of the output voltage and the threshold, the current indicator signal to indicate that the battery current flowing from the battery and into the first circuit falls below the threshold; and
 a second circuit to receive the current indicator signal from the comparator, and the second circuit to store a battery voltage from the battery in response to receiving the current indicator signal from the comparator, the stored battery voltage to represent a measured analog battery voltage at a specific time that the battery current flowing from the battery falls below the threshold.

2. The apparatus of claim 1, wherein the second circuit includes:
 a first sample and hold circuit to store the battery voltage from the battery in response to the current indicator signal.

3. The apparatus of claim 2, further comprising a third circuit to store a value corresponding to the battery voltage.

4. The apparatus of claim 3, wherein the third circuit includes:
 an analog to digital converter to convert the battery voltage from the first sample and hold circuit into a digital value; and
 one or more registers to store the digital value corresponding to the battery voltage.

5. The apparatus of claim 4, wherein the third circuit further includes a control device to control a timing of the analog to digital converter.

6. The apparatus of claim 3, further comprising a second sample and hold circuit to store a value that corresponds to the output voltage from the differential amplifier in response to the current indicator signal.

7. The apparatus of claim 6, further comprising an analog to digital converter to convert the value that corresponds to the output voltage into a digital value.

8. The apparatus of claim 1, wherein the apparatus is a mobile phone or a tablet.

9. The apparatus of claim 1, wherein the battery current flowing from the battery represents current drawn from the battery by at least one component of the apparatus.

10. A system comprising:
a processor;
a battery to power the processor; and
an apparatus to determine a voltage of the battery, the apparatus comprising:
a first circuit to receive a battery current from a battery, and to determine when the battery current from the battery and into the first circuit falls below a threshold, the first circuit includes:
a differential amplifier to receive a first input and a second input based on the battery current flowing from the battery, to sense the battery current from the battery based on the first input and the second input and to provide an output voltage based on the sensed current; and
a comparator to receive the output voltage from the differential amplifier and to provide a current indicator signal based on a comparison of the output voltage and the threshold, the current indicator signal to indicate that the battery current flowing from the battery falls below the threshold, and
a second circuit to receive the current indicator signal from the comparator, and the second circuit to store a battery voltage from the battery in response to receiving the current indicator signal from the comparator, the stored battery voltage to represent a measured analog battery voltage at a specific time that the battery current flowing from the battery falls below the threshold.

11. The system of claim 10, wherein the second circuit includes:
a first sample and hold circuit to store the battery voltage from the battery in response to the current indicator signal.

12. The system of claim 11, wherein the apparatus further comprises:
an analog to digital converter to convert the measured battery voltage from the first sample and hold circuit into a digital value; and
one or more registers to store the digital value.

13. The system of claim 12, further comprising a control device to control a timing of the analog to digital converter.

14. The system of claim 11, further comprising a second sample and hold circuit to store a value that corresponds to the output voltage from the differential amplifier in response to the current indicator signal.

15. The system of claim 14, further comprising:
an analog to digital converter to convert the value that corresponds to the output voltage into a digital value.

16. The system of claim 10, wherein the system is a mobile phone or a tablet.

17. The system of claim 10, wherein the battery current from the battery represents current drawn from the battery by at least one component of the apparatus.

18. A method of an electronic device, comprising:
sensing a battery current from a battery by using a sensing device;
determining, at the electronic device, when a battery current from the battery falls below a threshold, the determining including:
receiving a first input and a second input based on the battery current flowing from the battery,
sensing the battery current from the battery based on the first input and the second input,
providing an output voltage based on the sensed current,
comparing the output voltage with the threshold, and
providing a current indicator signal based on the comparing of the output voltage and the threshold, the current indicator signal to indicate that the battery current from the battery falls below the threshold; and
measuring a battery voltage in response to the current indicator signal, the measured battery voltage to represent a measured analog battery voltage at a specific time that the battery current from the battery is determined to fall below the threshold.

19. The method of claim 18,
wherein the battery voltage is stored in response to the current indicator signal.

20. The method of claim 18, further comprising:
converting the battery voltage into a digital value.

21. The method of claim 18, further comprising controlling components of the electronic device having the battery and the sensing device, based on the measured battery voltage.

* * * * *